US008859372B2

(12) United States Patent  (10) Patent No.: US 8,859,372 B2
 Liaw  (45) Date of Patent: Oct. 14, 2014

(54) DOUBLE CHANNEL DOPING IN TRANSISTOR FORMATION

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/763,291

(22) Filed: Feb. 8, 2013

(65) Prior Publication Data

US 2014/0227846 A1  Aug. 14, 2014

(51) Int. Cl.
 *H01L 21/8236* (2006.01)
 *H01L 29/15* (2006.01)
 *H01L 29/66* (2006.01)

(52) U.S. Cl.
 CPC .................. *H01L 29/66795* (2013.01)
 USPC ............................................. 438/283; 257/72

(58) Field of Classification Search
 CPC . H01L 21/336; H01L 27/092; H01L 21/8238; H01L 21/823431; H01L 21/823821; H01L 21/845; H01L 27/0886; H01L 27/0924; H01L 27/10826; H01L 27/10879; H01L 27/1211; H01L 29/41791; H01L 29/66772
 USPC ......... 438/283, 294–305, 270, 666, 591, 257, 438/167; 257/202–208, 34, 351, 369, 371, 257/397, 368, 401, 315, E21.616, E21.158, 257/E21.19, 4, E21.409, E27.06, E21.41, 257/E21.4, E21.15, 42
 See application file for complete search history.

(56) References Cited

U.S. PATENT DOCUMENTS

| | | | | |
|---|---|---|---|---|
| 2006/0214231 A1* | 9/2006 | Shah et al. | ...... | 257/347 |
| 2006/0240622 A1* | 10/2006 | Lee et al. | ...... | 438/257 |
| 2009/0134472 A1* | 5/2009 | Inaba | ...... | 257/390 |
| 2009/0321836 A1* | 12/2009 | Wei et al. | ...... | 257/365 |
| 2012/0292715 A1* | 11/2012 | Hong et al. | ...... | 257/392 |
| 2013/0009242 A1* | 1/2013 | Bhalla et al. | ...... | 257/331 |
| 2013/0083587 A1* | 4/2013 | Sekar et al. | ...... | 365/149 |
| 2013/0083589 A1* | 4/2013 | Or-Bach et al. | ...... | 365/149 |
| 2013/0134520 A1* | 5/2013 | Maeda et al. | ...... | 257/368 |
| 2013/0187237 A1* | 7/2013 | Yu et al. | ...... | 257/369 |
| 2013/0224939 A1* | 8/2013 | Jagannathan et al. | ...... | 438/585 |
| 2013/0277746 A1* | 10/2013 | Baldauf et al. | ...... | 257/368 |
| 2014/0070328 A1* | 3/2014 | Goto et al. | ...... | 257/401 |

* cited by examiner

*Primary Examiner* — Chuong A Luu
*Assistant Examiner* — Sheikh Maruf
(74) *Attorney, Agent, or Firm* — Slater & Matsil, L.L.P.

(57) ABSTRACT

A method includes performing a first well doping on a first active region and a second active region simultaneously, and forming a first and a second dummy gate covering a first middle portion of the first active region and a second middle portion of the second active region, respectively. The first and the second dummy gates are removed, and the second middle portion of the second active region is covered with a mask. A second well doping is performed on the first middle portion when the mask is on the second middle portion. After the second well doping, a first gate dielectric and a first gate electrode are formed on the first middle portion to form a first transistor, and a second gate dielectric and a second gate electrode are formed on the second middle portion to form a second transistor.

20 Claims, 15 Drawing Sheets

DOUBLE CHANNEL DOPING IN TRANSISTOR FORMATION

BACKGROUND

Threshold voltage is one of important characteristics that affect the performance of a transistor. The threshold voltage of a transistor is often affected by its well doping concentration. To increase the threshold voltage of a transistor, the well doping concentration may be increased, and vice versa.

The increase in the well doping concentration, however, faces challenges. For example, Fin Field-Effect Transistors (FinFETs) have semiconductor fins as their channels. With the increasing down scaling of integrated circuits, the semiconductor fins become increasingly narrower. When high threshold voltages are needed for the FinFETs, higher doses of impurities are implanted into the semiconductor fins to increase the well doping concentrations. Due to the very narrow fins, in the subsequent thermal processes, however, most of the implanted impurities may be diffused away, and the well doping impurity that is left in the final structure is becoming an increasingly smaller portion. As a result, heavier doses of impurities are needed.

Increasing the already high implantation doses, however, results in high threshold voltage variations. The out-diffusion of the impurity from a narrow fin is affected by various factors, and has high variations. From wafer to wafer, and even from FinFET to FinFET on the same wafer, the out-diffusion may vary significantly. This results in the well doping concentration of the FinFETs to vary also. The threshold voltages of the resulting FinFETs thus have a high variation.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Methods for increasing the threshold voltages of transistors are provided in accordance with various embodiments. The intermediate stages of forming the transistors are illustrated. The variations of the embodiments are discussed. Throughout the various views and illustrative embodiments, like reference numbers are used to designate like elements. In the illustrated embodiments, Fin Field-Effect Transistors (FinFETs) and the transistors in Static Random Access Memory (SRAM) cells are discussed as examples to explain the concept of the present disclosure. The concept of the present disclosure, however, is also applicable to the formation of other transistors including, and not limited to, logic devices, planar transistors, and the like.

Figure 1:
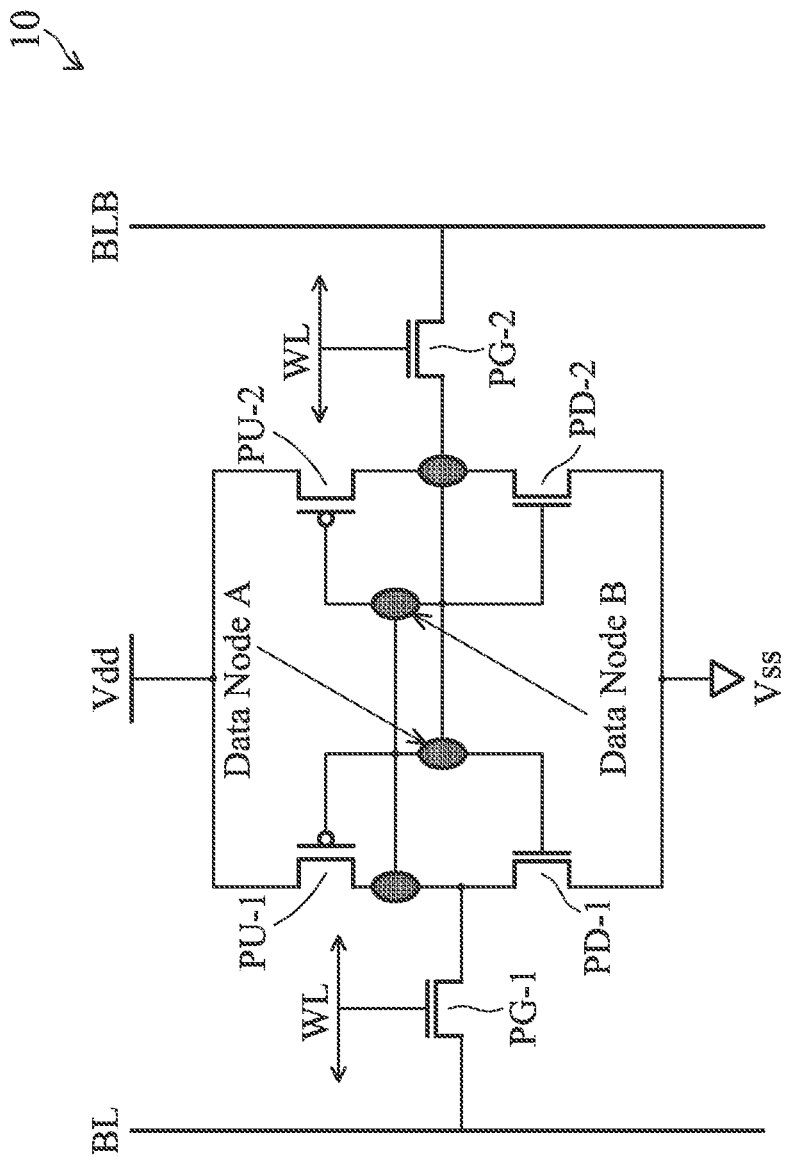
FIG. 1 is a circuit diagram of a Static Random Access Memory (SRAM) cell in accordance with exemplary embodiments.

FIG. 1 illustrates a circuit diagram of SRAM cell 10 in accordance with some embodiments. SRAM cell 10 includes pass-gate transistors PG-1 and PG-2 and pull-down transistors PD-1 and PD-2, which are N-type Metal-Oxide-Semiconductor (NMOS) transistors. SRAM cell 10 further includes pull-up transistors PU-1 and PU-2, which are P-type Metal-Oxide-Semiconductor (PMOS) transistors. The gates of pass-gate transistors PG-1 and PG-2 are connected to word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in data node A and data node B. The stored bit can be written into, or read from, SRAM cell 10 through bit lines BL and BLB.

The sources of pull-up transistors PU-1 and PU-2 are connected to voltage node Vdd, which carries positive power supply voltage (and line) Vdd. The sources of pull-down transistors PD-1 and PD-2 are connected to power supply node Vss, which are further connected to power supply voltage/line Vss (an electrical ground, for example). The gates of transistors PU-1 and PD-1 are connected to the drains of transistors PU-2 and PD-2, which connection node is data node A. The gates of transistors PU-2 and PD-2 are connected to the drains of transistors PU-1 and PD-1, which connection node is data node B. A source or drain region (referred to as source/drain region hereinafter) of pass-gate transistor PG-1 is connected to bit-line BL. A source/drain region of pass-gate transistor PG-2 is connected to bit-line BLB.

Figure 2:
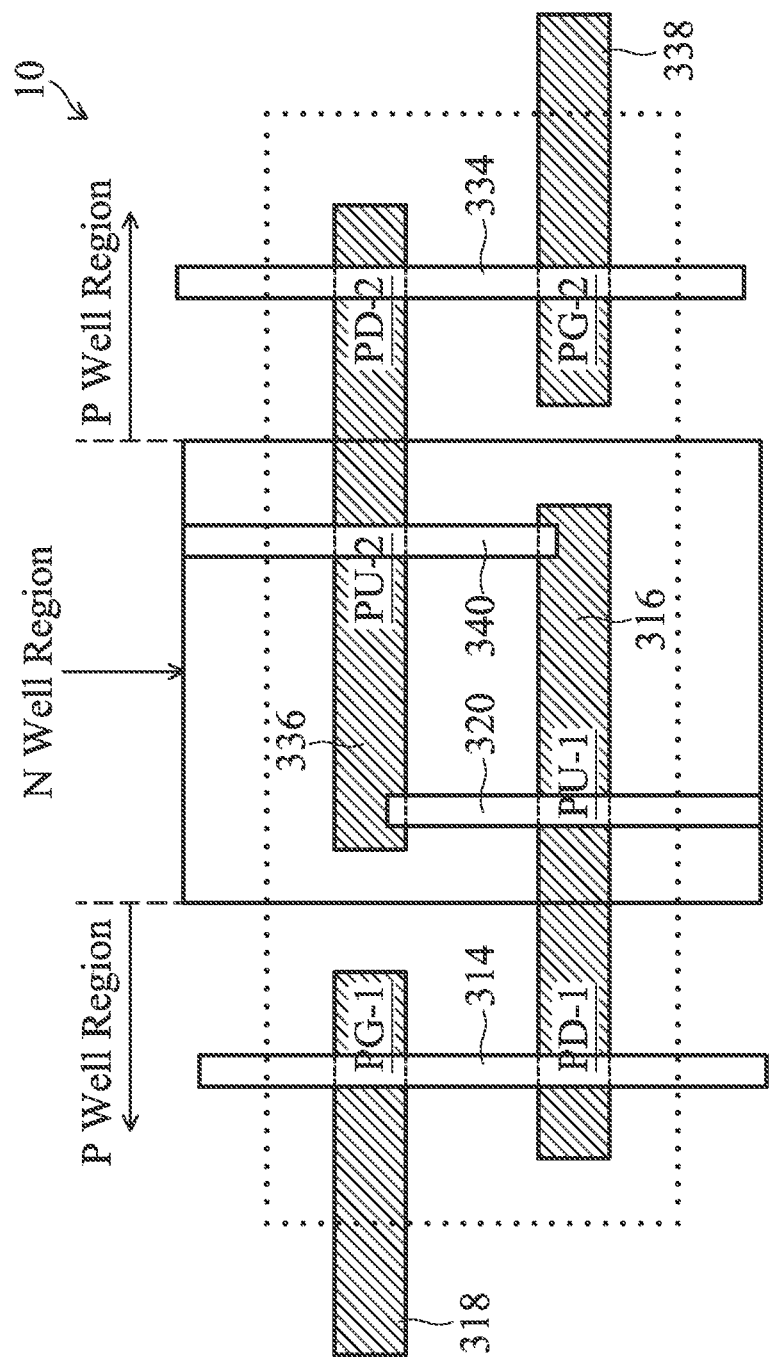
FIG. 2 illustrates a part of an exemplary top view of an SRAM cell, which is formed of Fin Field-Effect Transistors (FinFETs) in accordance with exemplary embodiments.

FIG. 2 illustrates a part of an exemplary top view of SRAM cell 10 in accordance with exemplary embodiments. The outer boundaries of SRAM cell 10 are illustrated using dashed lines, which forms a rectangle. For clarity, various nodes and contact plugs such as the Vdd node, the Vss node, the BL node, and the BLB node, which are shown in FIG. 1, are not illustrated in FIG. 2. Gate electrode 316 forms pull-up transistor PU-1 with the underlying active region (an n-well region) 320, which may be a fin-based region. Gate electrode 316 further forms pull-down transistor PD-1 with the underlying active region (a p-well region) 314, which may be a fin-based region. Gate electrode 318 forms pass-gate transistor PG-1 with the underlying active region 314. Gate electrode 336 forms pull-up transistor PU-2 with the underlying active region (an n-well region) 340. Gate electrode 336 further forms pull-down transistor PD-2 with the underlying active region (a p-well region) 334. Gate electrode 338 forms pass-gate transistor PG-2 with the underlying active region 334. Transistors PG-1 and PG-2, PU-1 and PU-2, and PD-1 and PD-2 may be Fin Field-Effect Transistors (FinFETs) in accordance with some embodiments.

Figure 3:
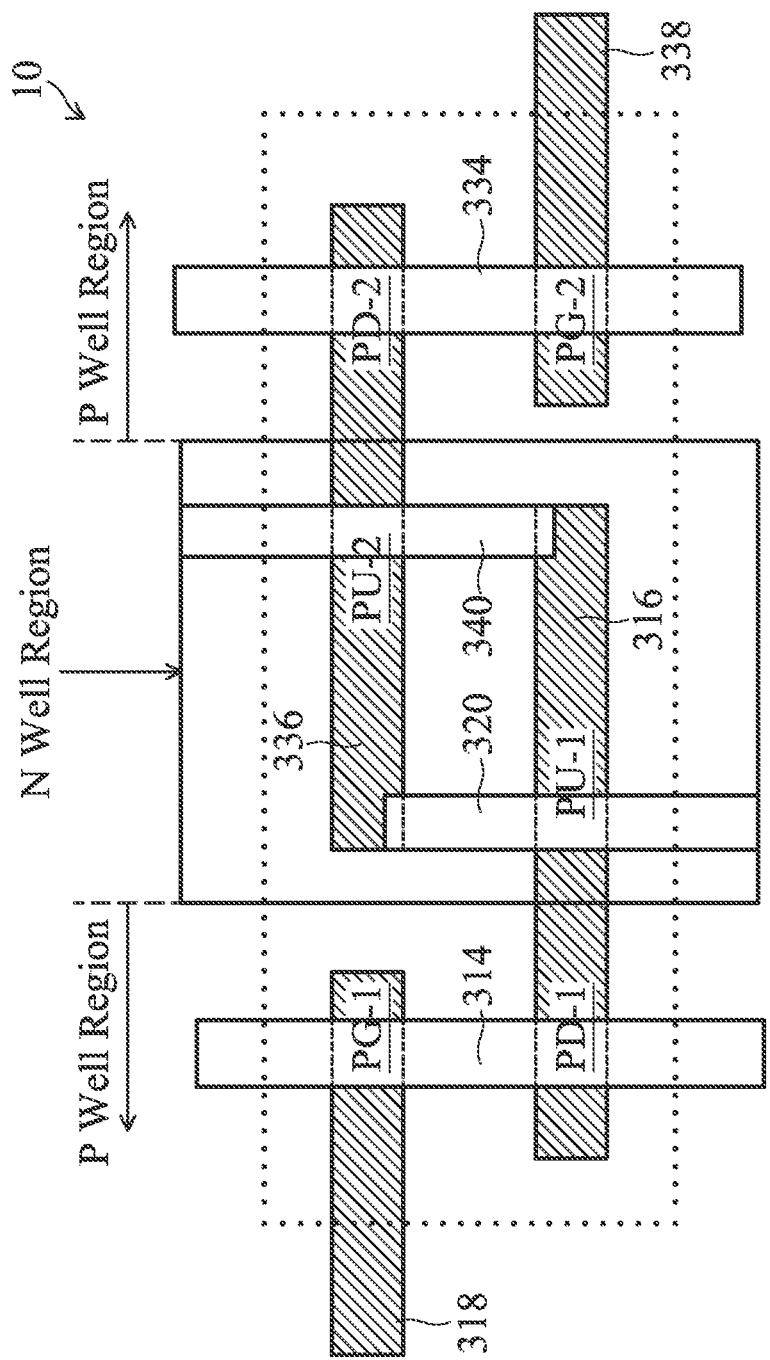
FIG. 3 illustrates a part of an exemplary top view of an SRAM cell, which is formed of planar transistors in accordance with exemplary embodiments.

FIG. 3 illustrates SRAM cell 10 in accordance with alternative embodiments, wherein transistors PU-1, PU-2, PD-1, PD-2, PG-1, and PG-2 are planar transistors. Accordingly, active regions 314, 320, 340, and 334 are planar active regions. Further, active regions 314, 320, 340, and 334 are much wider in the FinFETs in FIG. 2 than in FIG. 1.

Figure 4:
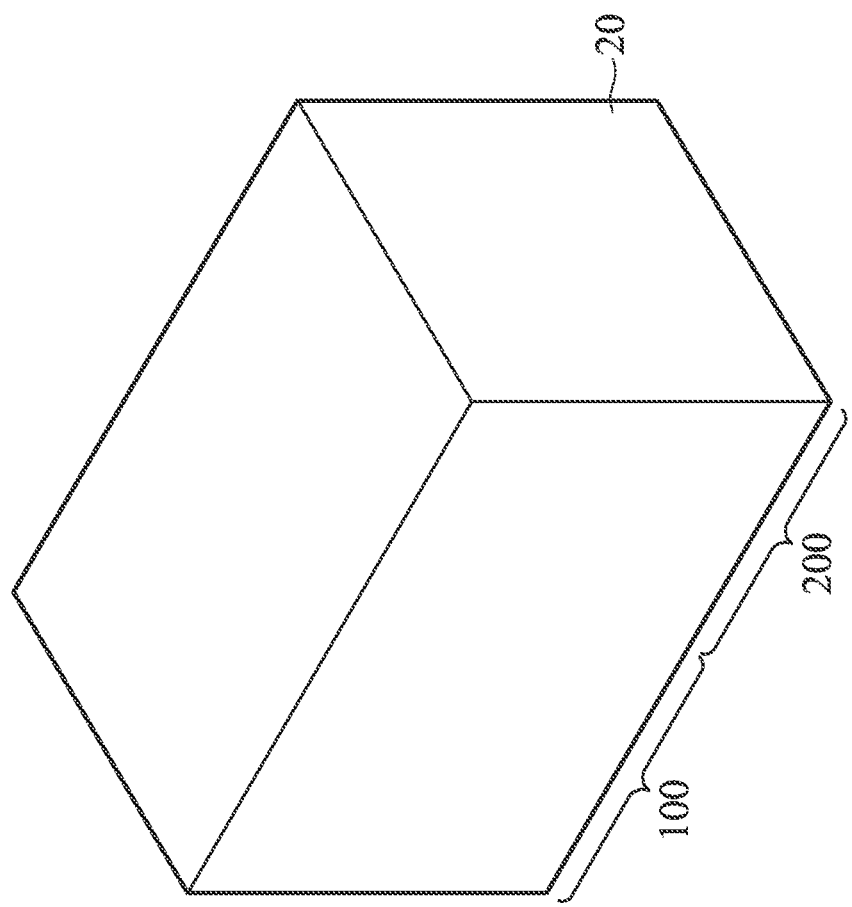
FIGS. 4 through 13B are perspective views and cross-sectional views of intermediate stages in the formation of FinFETs in accordance with various embodiments.

FIGS. 4 through 13B are cross-sectional views and perspective views of intermediate stages in the manufacturing of FinFETs 160 and 260 (FIGS. 13A and 13B) in accordance with some exemplary embodiments. Each of FinFETs 160 and 260 may be any of devices PG-1, PG-2, PU-2, PU-2, PD-1, and PD-2 in FIG. 2 or 3. FIG. 4 illustrates a perspective view of substrate 20, which is a part of a wafer. Substrate 20 may be a semiconductor substrate, which may further be a silicon substrate, a silicon carbon substrate, or a substrate formed of other semiconductor materials. Substrate 20 may be lightly doped with a p-type or an n-type impurity. Substrate 20 includes a first portion in region 100, and a second portion in region 200. Although the portion of substrate 20 between the first portion and the second portion of substrate 20 is not shown, the first and second portions belong to a continuous substrate 20. In the subsequently discussed examples, FinFETs 160 and 260 (FIGS. 13A and 13B) are n-type FinFETs. The teaching provided in the present disclosure, however, is readily available for the formation of p-type FinFETs, with the conductivity types of the respective well regions, source and drain regions, etc. inverted.

Figure 5:
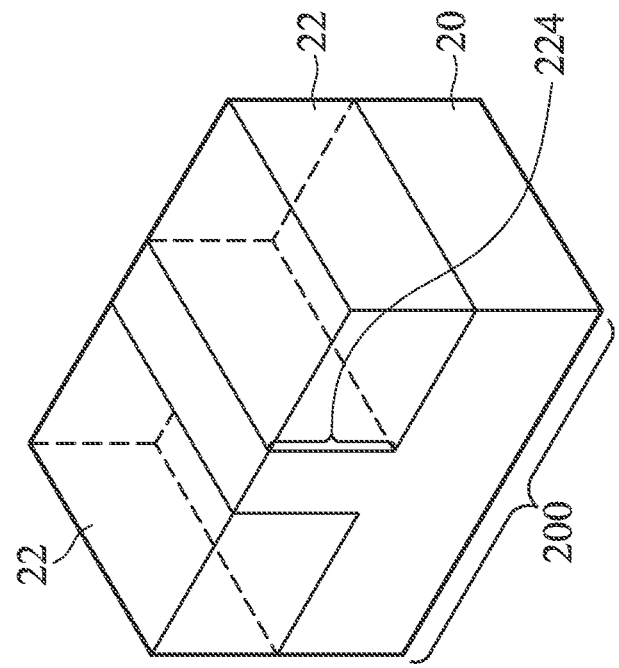
Figure 5:
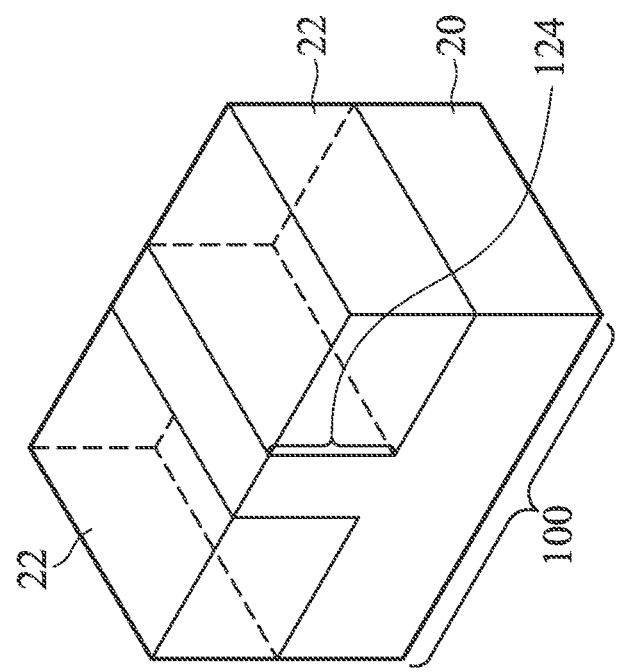

Next, referring to FIG. 5, isolation regions 22 are formed, which extend from a top surface of substrate 20 into substrate 20. Isolation regions 22 may be Shallow Trench Isolation (STI) regions, and are referred to as STI region 22 hereinafter. The formation of STI regions 22 may include etching semiconductor substrate 20 to form trenches (not shown), and filling the trenches with a dielectric material to form STI regions 22. STI regions 22 may comprise silicon oxide, for example, although other dielectric materials may also be used. The portions of substrate 20 between neighboring STI regions 22 are referred to as semiconductor strips 124 and 224 throughout the description. Semiconductor strips 124 and 224 are in regions 100 and 200, respectively. The top surfaces of semiconductor strips 124 and 224 and the top surfaces of STI regions 22 may be substantially level with each other, although they may be at slightly different levels.

Figure 6:
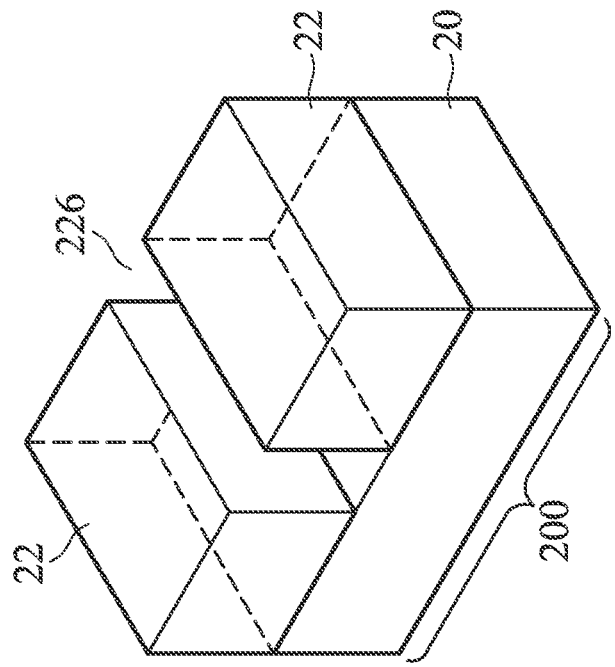
Figure 6:
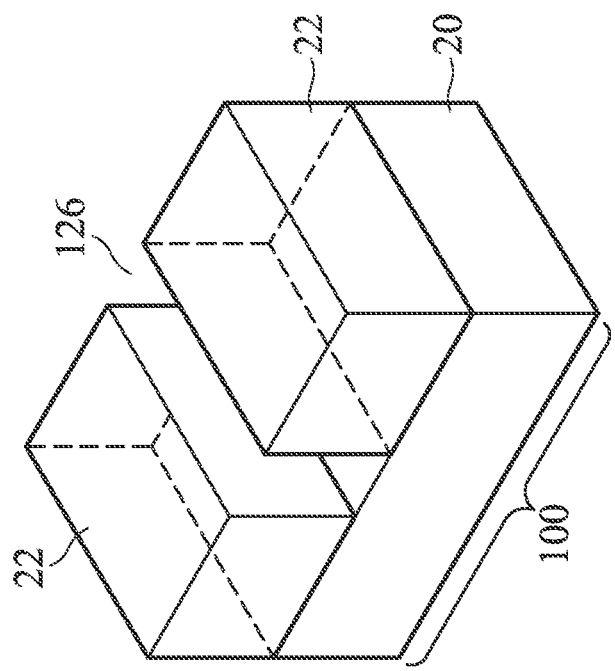
Figure 7:
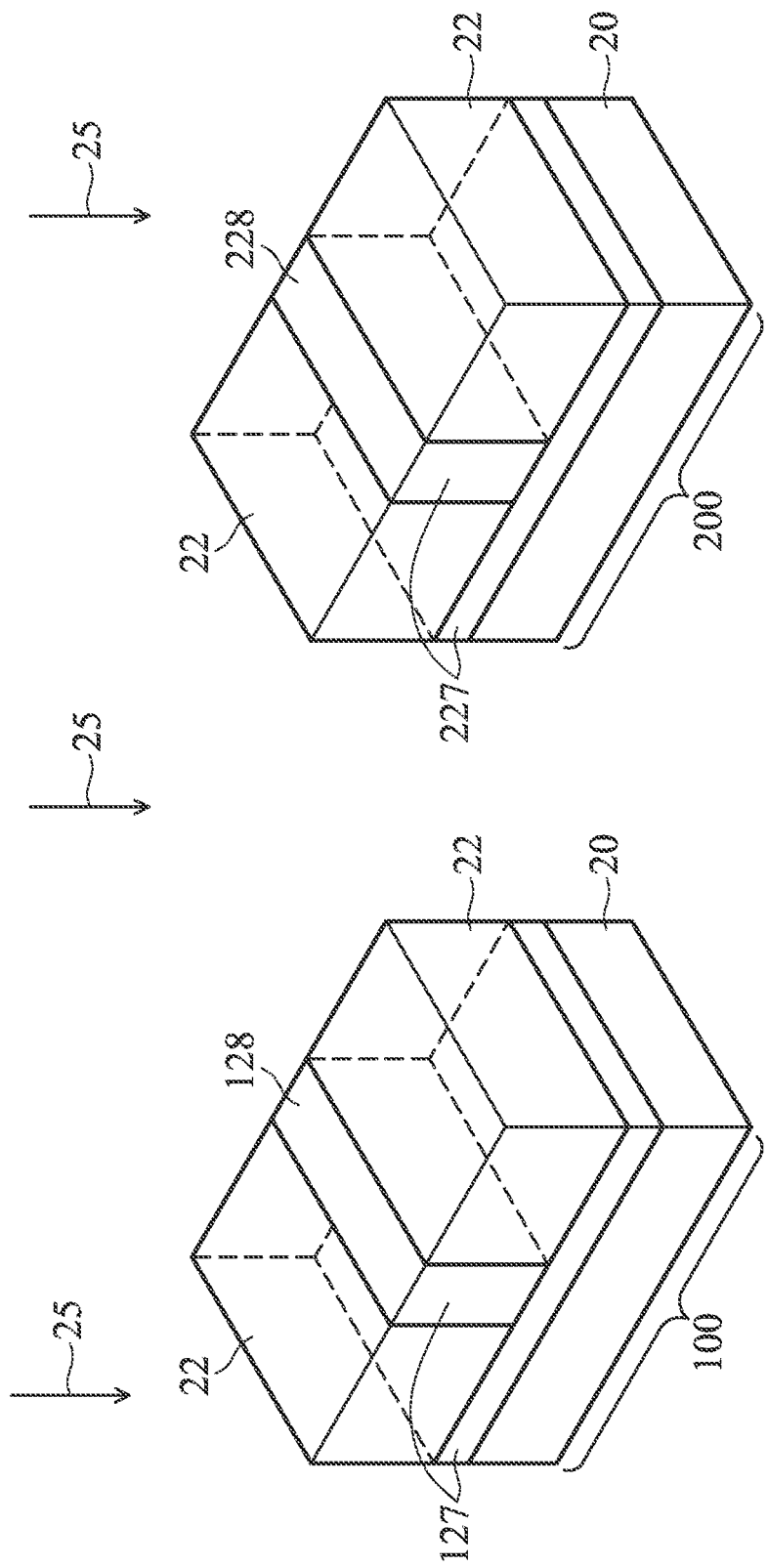

In accordance with some exemplary embodiments, the steps shown in FIGS. 6 and 7 are performed to replace the materials of semiconductor strips 124 and 224 in order to form semiconductor strips 128 and 228. In alternative embodiments, the replacement steps are not performed. Referring to FIG. 6, at least top portions of, or substantially entireties of, semiconductor strips 124 and 224 in FIG. 5 are removed. Accordingly, recesses 126 and 226 are formed between STI regions 22. The bottom surfaces of recesses 126 and 226 may be level with the bottom surfaces of STI regions 22. Alternatively, the bottom surfaces of recesses 126 and 226 may be higher than or lower than the bottom surfaces of STI regions 22.

An epitaxy is performed to grow a semiconductor material in recesses 126 and 226. The resulting structure is shown in FIG. 7, wherein the epitaxy semiconductor forms semiconductor strips 128 and 228 in regions 100 and 200, respectively. A Chemical Mechanical Polish (CMP) is then performed to level the top surfaces of semiconductor strips 128 and 228 with the top surfaces of STI regions 22. Semiconductor strips 128 and 228 may have a lattice constant greater than, substantially equal to, or smaller than, the lattice constant of substrate 20, depending on the intended conductivity types of the resulting FinFETs. Further depending on whether the resulting FinFETs are p-type FinFETs n-type FinFET, semiconductor strips 128 and 228 may comprise silicon germanium, silicon carbon, pure or substantially pure germanium, a III-V compound semiconductor, a II-VI compound semiconductor, or the like. For example, the available materials for forming III-V compound semiconductor strips 128 and 228 include, but are not limited to, InAs, AlAs, GaAs, InP, GaN, InGaAs, InAlAs, GaSb, AlSb, AlP, GaP, and the like.

In some embodiments, after the epitaxy and the CMP, an implantation step 25 is performed, which step is referred to as a first well doping step. As a result, well regions 127 and 227 are formed in regions 100 and 200, respectively. The bottom surfaces of well regions 127 and 227 may be lower than, although they may also be level with or higher than, the bottom surfaces of STI regions 22. In some embodiments, the first well doping is performed by implanting a p-type impurity, such as boron, indium, or the like. The dosage for implanting well regions 127 and 227 may be between about $1E12/cm^2$ and about $5E14/cm^2$, for example. In alternative embodiments, semiconductor strips 128 and 228 are in-situ doped during the epitaxy to receive the first well doping.

In alternative embodiments, the process steps in FIGS. 6 and 7 are skipped, and semiconductor strips 124 and 224 in FIG. 5 remain not replaced. In which embodiments, semiconductor strips 124 and 224 in FIG. 5 are also referred to as semiconductor strips 128 and 228, respectively, in subsequent discussion. Semiconductor strips 128 and 228 in accordance with these embodiments are formed of the same semiconductor material as semiconductor substrate 20. Furthermore, in these embodiments, implantation step 25 is also performed to form well regions 127 and 227.

Figure 8:
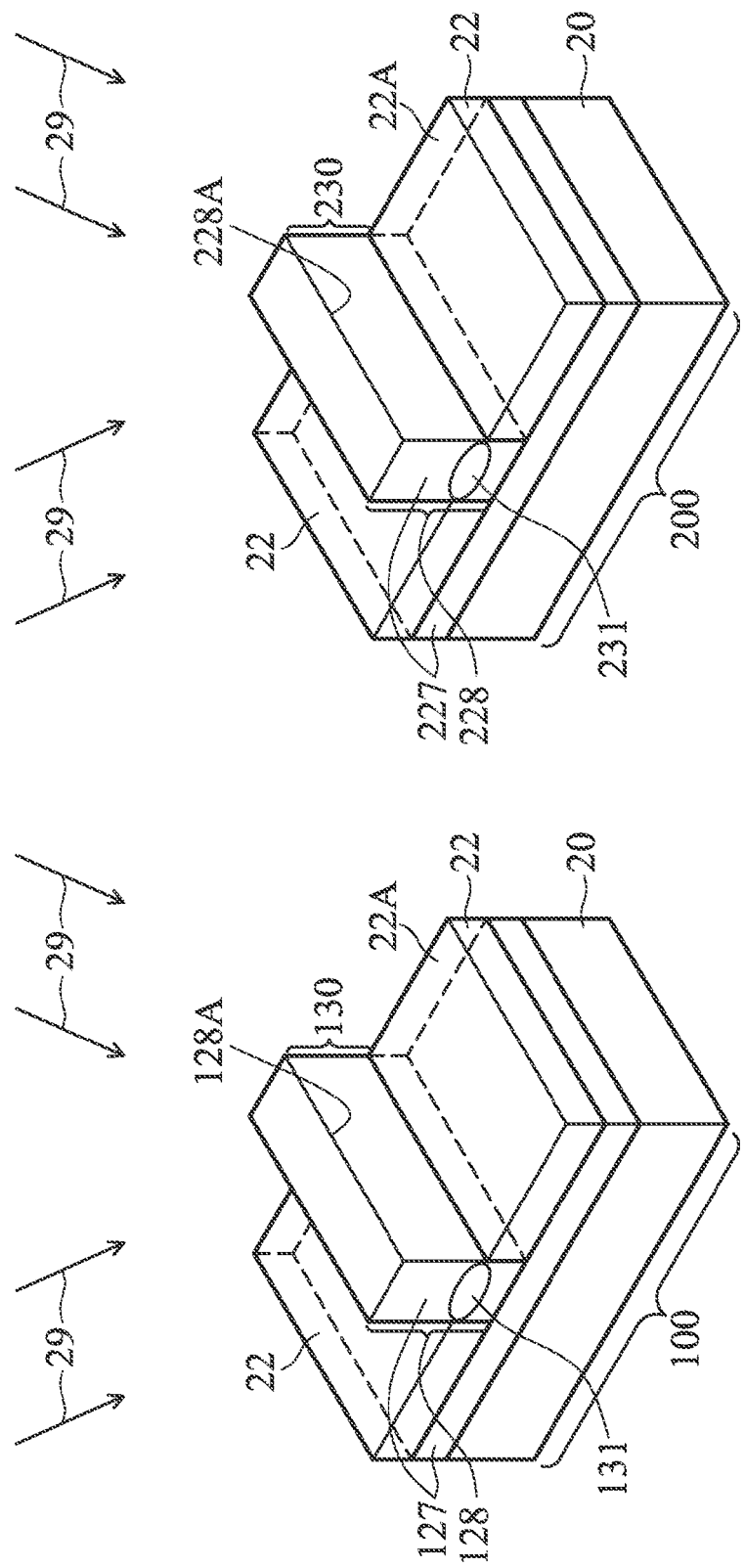

Referring to FIG. 8, STI regions 22 are recessed, for example, through an etching step. The top surfaces 22A of the remaining STI regions 22 are thus lower than top surface 128A and 228A of semiconductor strips 128 and 228, respectively. Throughout the description, the portions of semiconductor strips 128 and 228 over top surface 22A are referred to as semiconductor fins 130 and 230, respectively. Semiconductor fins 130 and 230 are also referred to as active regions for forming the resulting transistors (FinFETs in the illustrated examples).

In accordance with some embodiments, an additional p-type implantation step 29 is performed, which may include tilt implantations from the opposite sides of semiconductor fins 130 and 230. As a result, Anti-Punch-Through (APR) regions 131 and 231 are formed. APR regions 131 and 231 have higher p-type impurity concentrations than the lower portions of semiconductor strips 128 and 228. APR regions 131 and 231 are in semiconductor strips 128 and 228, and extend to the positions slightly lower than the top surfaces of STI regions 22. In alternative embodiments, the formation of APR regions 131 and 231 is skipped. For clarity, in subsequent drawings, APR regions 131 and 231 are not illustrated.

Figure 9:
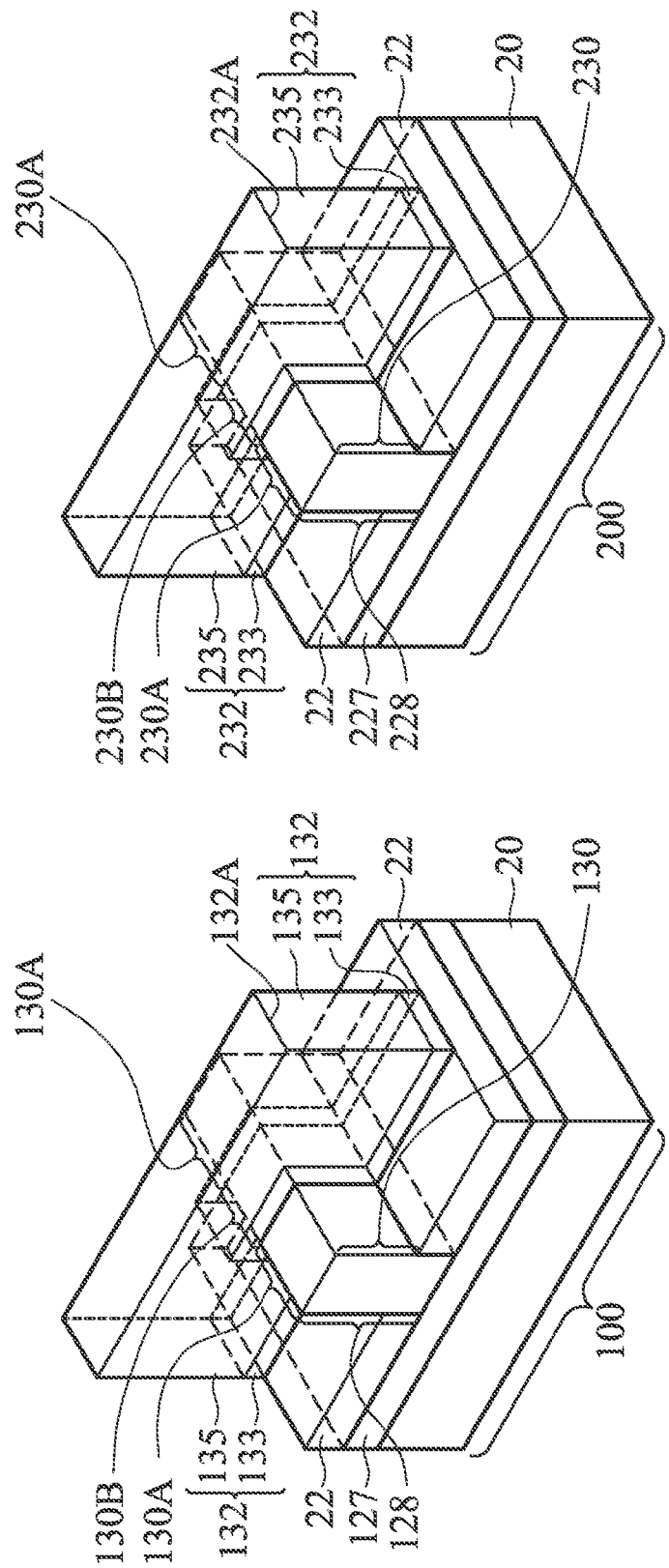

Referring to FIG. 9, dummy gate stacks 132 and 232 are formed. In some embodiments, dummy gate stacks 132 and 232 include dummy gate electrodes 135 and 235 and the underlying dummy gate dielectrics 133 and 233. Dummy gate electrodes 135 and 235 may comprise, for example, polysilicon. The formation of dummy gate stacks 132 and 232 may include forming blank layer(s), performing a CMP to level the top surface of the blank layer(s), and patterning the blank layers. The remaining portions of the blank layers(s) are dummy gate stacks 132 and 232. Dummy gate stacks 132 and 232 cover middle portions 130B and 230B of semiconductor fins 130 and 230, respectively. Opposite end portions 130A and 230A of semiconductor fins 130 and 230 are not covered. Dummy gate stacks 132 and 232 may also have a lengthwise direction substantially perpendicular to the lengthwise direction of semiconductor fins 130 and 230.

Figure 10:
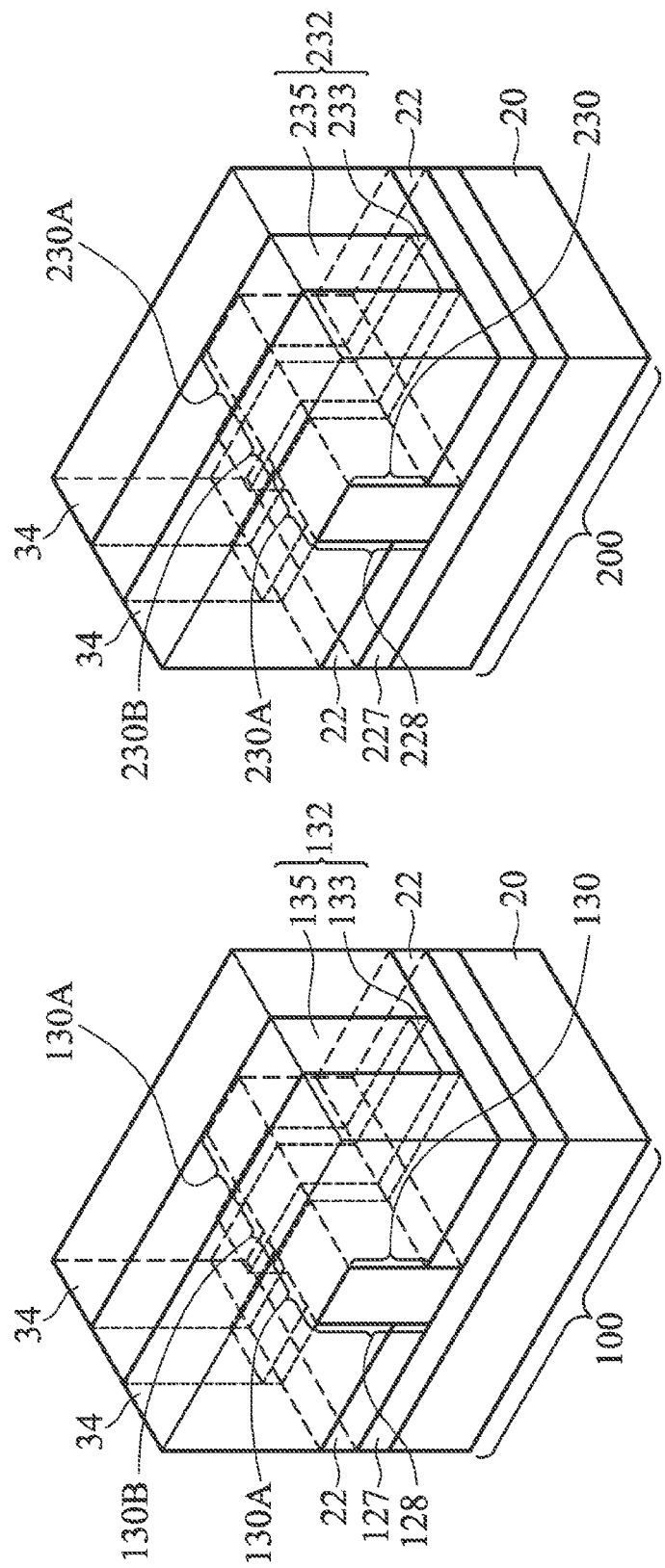

FIG. 10 illustrates a perspective view of the structure after Inter-Layer Dielectric (ILD) 34 is formed. ILD 34 comprises a dielectric material such as Phospho-Silicate Glass (PSG), Boro-Silicate Glass (BSG), Boron-Doped Phospho-Silicate Glass (BPSG), or the like. A CMP may be performed to level the top surface of ILD 34 with the top surface of dummy gate stacks 132 and 232. Accordingly, end portions 130A and 230A are buried under ILD 34. Although not shown, before the formation of ILD 34, spacers may be formed on the opposite sidewalls of dummy gate stacks 132 and 232, wherein the spacers may be formed of a material different from the materials of ILD 34 and dummy gate stacks 132 and 232.

Figure 11A:
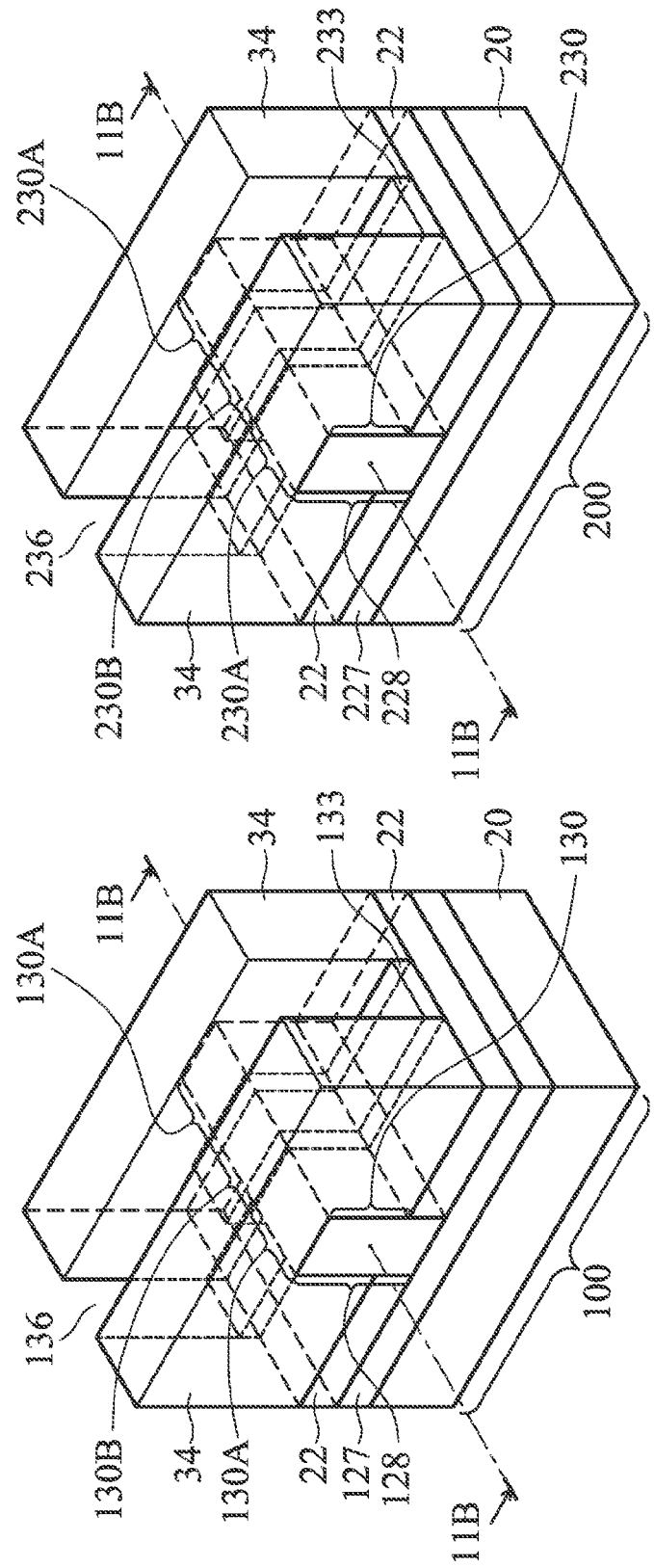
Figure 11B:
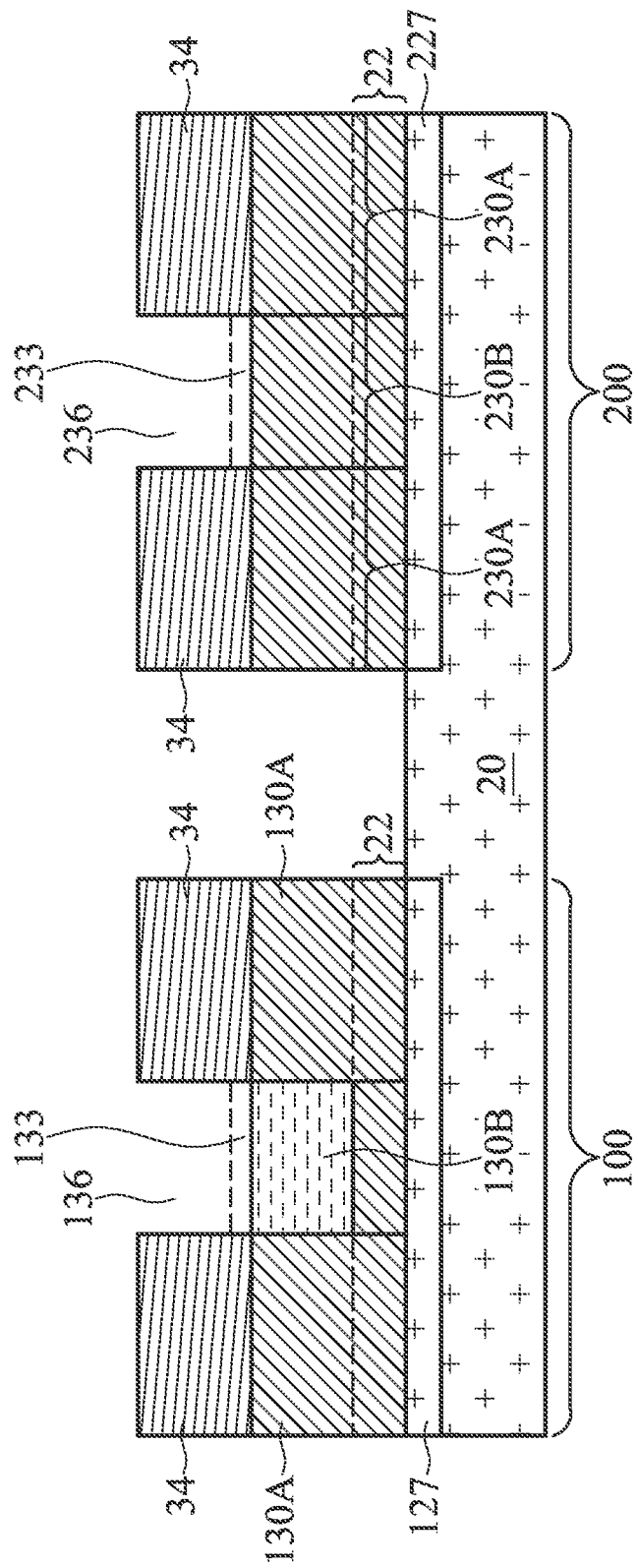

Next, referring to FIGS. 11A and 11B, dummy gate stacks 132 and 232 are at least partially removed in an etching step, so that recesses 136 and 236 are formed in ILD 34. Recesses 136 and 236 are located in regions 100 and 200, respectively. FIG. 11A illustrates a perspective view, and FIG. 11B illustrates the cross-sectional view obtained from the planes crossing lines 11B-11B in FIG. 11A.

As shown in FIG. 11B, fin portions 130B and 230B are not covered by ILD 34. Fin end portions 130A and 230A are covered by ILD 34. In some embodiments, dummy gate stacks 132 and 232, which are formed in the step shown in FIG. 9, include dummy gate dielectrics 133 and 233, respectively. In these embodiments, dummy gate dielectrics 133 and 233 may be left un-removed (although they can also be removed), while dummy gate electrodes 135 and 235 (FIG. 10) are etched. In alternative embodiments, dummy gate stacks 132 and 232 do not include dummy gate dielectrics when formed in the step shown in FIG. 9, and fin portions 130B and 230B are exposed after the step in FIGS. 11A and 11B are performed.

Figure 12:
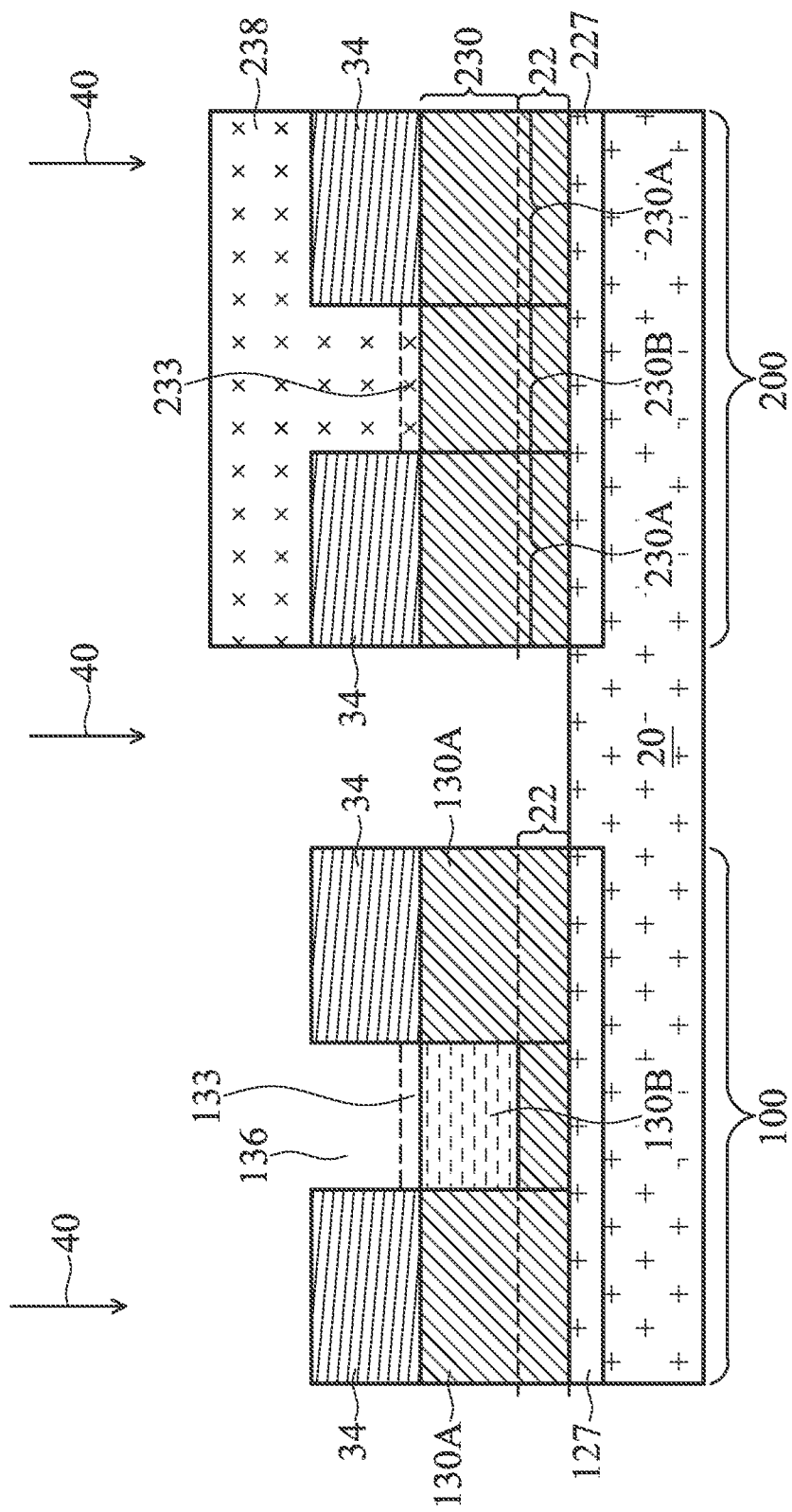

FIG. 12 illustrates the additional well doping 40 performed on fin portion 130B. Mask 138 is formed to mask region 200 from receiving the additional well doping 40. Mask 238 may be formed of a photo resist, although it may also be formed of other materials. The well doping 40 may be performed through an implantation step. In the implantation, a p-type impurity is implanted. As a result, fin portion 130B has a higher p-type impurity concentration than fin portion 230B. The dosage of the implantation may be between about $3E12/cm^2$ and about $3E14/cm^2$, for example. The implanted region may have a bottom surface level with, higher than, or lower than, the bottom surface of semiconductor fin 130, which is level with the top surface of STI regions 22 (FIG. 11A). After the implantation, mask 238 is removed. In the embodiments wherein dummy gate dielectrics 133 and 233 are formed, the implanted p-type impurity penetrates through dummy gate dielectrics 133 and 233 to reach fin portion 130B. After the implantation, dummy gate dielectrics 133 and 233 are also removed.

Figure 13A:
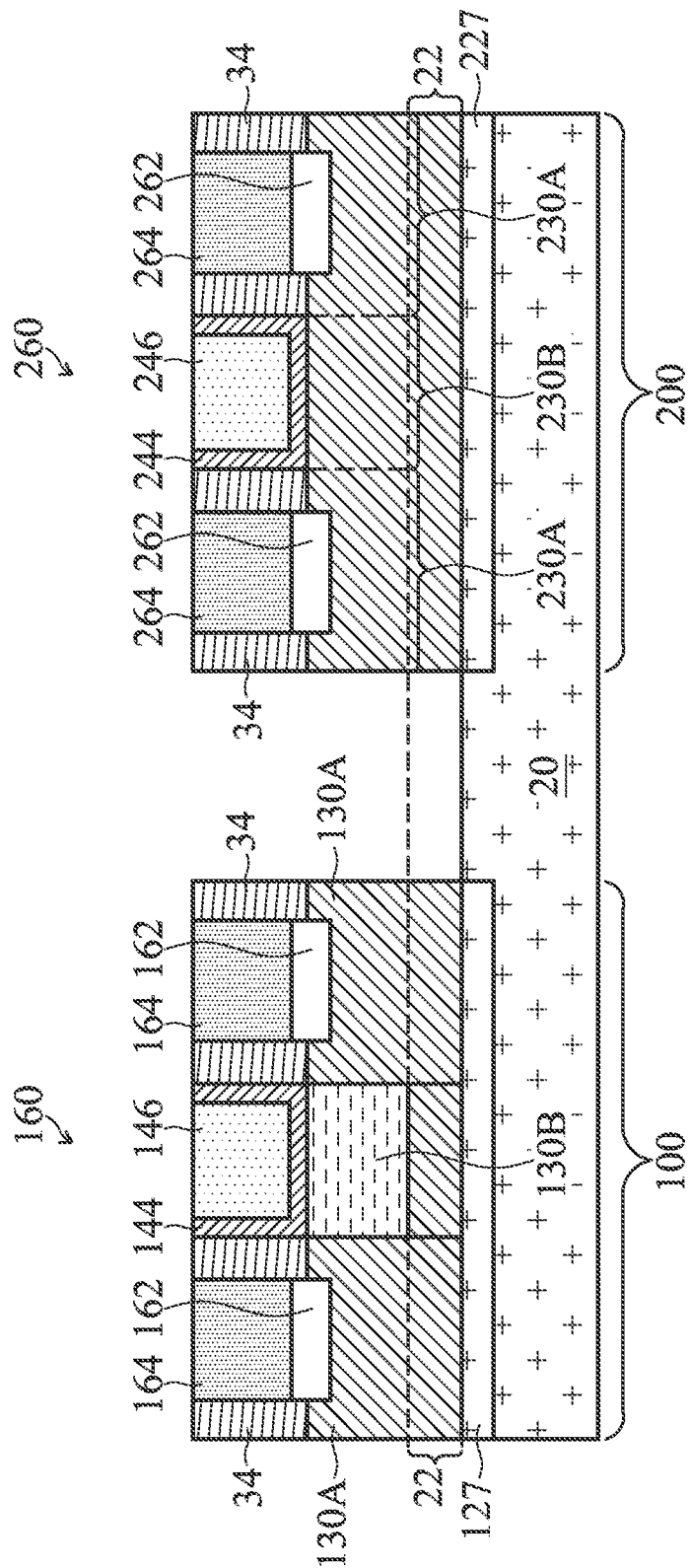
Figure 13B:
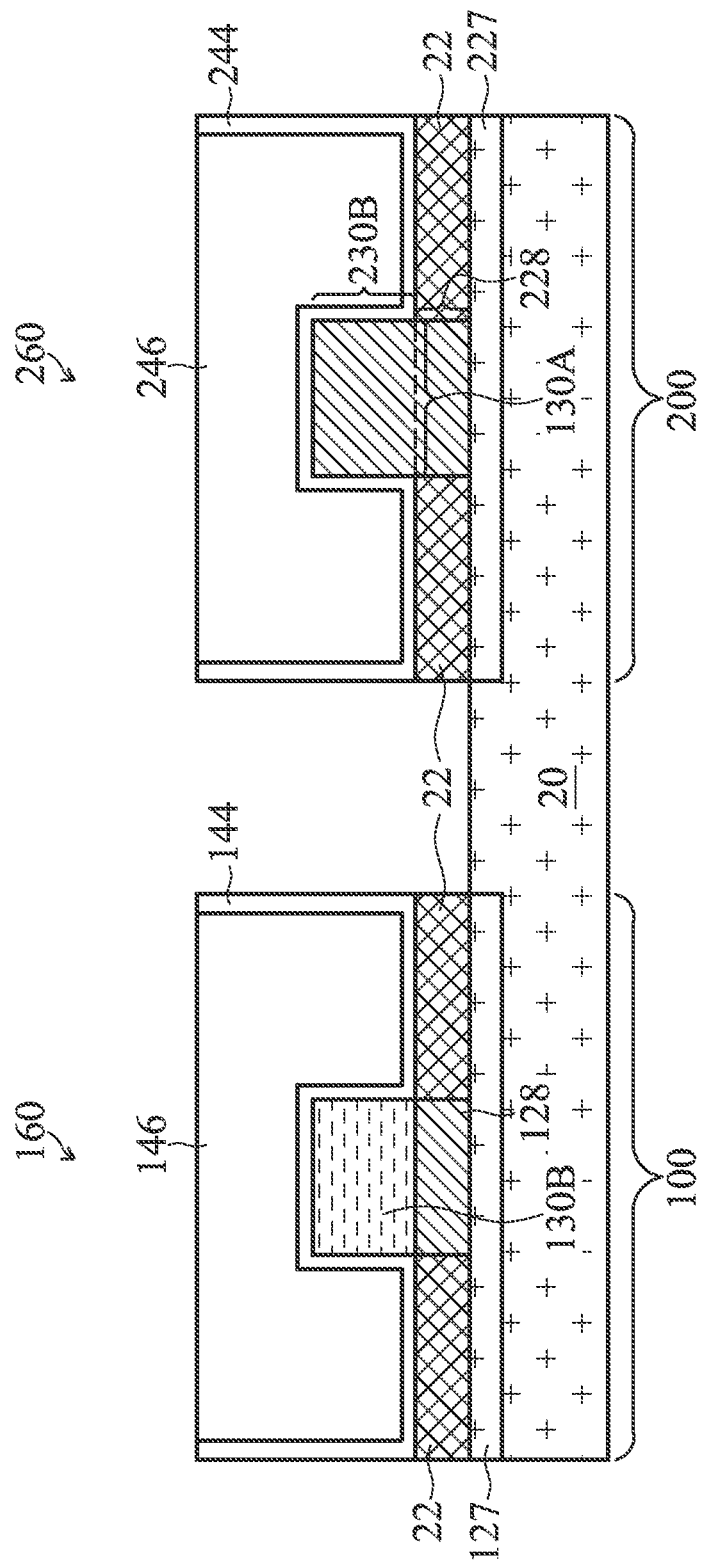

FIGS. 13A and 13B illustrate the formation of replacement gates, which include gate dielectrics 144 and 244 and gate electrodes 146 and 246. FIG. 13A illustrates the cross-sectional views obtained from the planes parallel to the source-to-drain directions of FinFETs 160 and 260. FIG. 13B illustrates the cross-sectional views obtained from the planes perpendicular to the source-to-drain directions of FinFETs 160 and 260.

The intermediate stages in the formation of gate dielectrics 144 and 244 and gate electrodes 146 and 246 are not illustrated, and are described briefly below. In the formation process, a gate dielectric layer (not shown) is formed as a blanket layer in recesses 136 and 236 (FIG. 11A and 11B) and on the top surfaces and the sidewalls of semiconductor fin portions 130B and 230B and ILD 34 (also see FIGS. 11A and 11B). In accordance with some embodiments, the gate dielectric layer comprises silicon oxide, silicon nitride, or multilayers thereof. In alternative embodiments, the gate dielectric layer comprises a high-k dielectric material. In which embodiments, the gate dielectric layer may have a k value greater than about 7.0, and may include a metal oxide of Hf, Al, Zr, La, Mg, Ba, Ti, Pb, and combinations thereof. The formation methods of the gate dielectric layer may include Molecular-Beam Deposition (MBD), Atomic Layer Deposition (ALD), Plasma Enhanced Chemical Vapor Deposition (PECVD), or the like. Next, a conductive material (not shown) is deposited over the gate dielectric layer, and fills the remaining recesses 136 and 236 (FIG. 11A). The conductive material may comprise a metal-containing material such as TiN, TaN, TaC, Co, Ru, Al, combinations thereof, or multi-layers thereof. After the deposition of the conductive material, a CMP is performed to remove the excess portions of the gate dielectric layer and the conductive material, which excess portions are over the top surface of ILD 34. The resulting remaining portions of the conductive material and the gate dielectric layer thus form the replacement gates of the resulting FinFETs 160 and 260 in regions 100 and 200, respectively.

FIG. 13A also illustrates, in addition to the formation of gate dielectric 44 and gate electrode 46, the formation of source and drain silicide regions 162 and 262 and source/drain contact plugs 164 and 264. The formation process may include forming contact openings (occupied by contact plugs 164 and 264) in ILD 34 to expose end substrate portions 130A and 230A. End portions 130A and 230A may be heavily implanted with an n-type impurity through the contact openings in an implantation step. A silicidation step is then performed to silicide the exposed end portions 130A and 230A to form source/drain silicide regions 162 and 262. Contact plugs 164 and 264 are then formed to fill the openings. In the resulting FinFETs 160 and 262, end portions 130A and 230A form source and drain regions of FinFETs 160 and 260, respectively. In some embodiments, pocket regions are not formed for FinFETs 160 and 260.

The FinFETs 160 and 260 in accordance with the embodiments may be any of the devices in FIGS. 2 and 3. In accordance with the embodiments, the formation of the channel region of FinFET 160 includes two well doping steps. The first doping step 25 (FIG. 7) is performed before the formation and the removal of dummy gate stacks 132 and 232 (FIGS. 9 and 10). During the first doping step, the entireties of fins 130 and 230 may be doped simultaneously. The second doping step is performed on the channel region 130B of FinFET 160 (FIG. 13A), and not on channel region 230B of FinFET 260. Due to the second well doping, FinFET 160 has a high well doping concentration, and hence a high threshold voltage. Since the second well doping is after the formation of source and drain regions, the thermal budget received by the impurities doped in the second well doping is small, and the out-diffusion of the doped impurity is less significant. Accordingly, the amount of doping for the well formation may be reduced, while the remaining dopant amount in the well region of FinFET 160 is still high. Furthermore, in accordance with the embodiments of the present disclosure, FinFETs 160 and 260 with different threshold voltages may be formed using a same process flow.

In accordance with some embodiments, a method includes performing a first well doping on a first active region and a second active region simultaneously, and forming a first and a second dummy gate covering a first middle portion of the first active region and a second middle portion of the second active region, respectively. The first and the second dummy gates are removed. After the step of removing the first and the second dummy gates, the second middle portion of the second active region is covered with a mask, and a second well doping is performed on the first middle portion when the mask is on the second middle portion. The end portions of the first active region on opposite sides of the first middle portion are masked during the second well doping. After the second well doping, a first gate dielectric and a first gate electrode are formed on the first middle portion to form a first transistor, and a second gate dielectric and a second gate electrode are formed on the second middle portion to form a second transistor.

In accordance with other embodiments, a method of forming a transistor in an SRAM cell includes performing a first well doping on an active region. After the first well doping, a dummy gate is formed to cover a middle portion of the active region, wherein end portions of the active region on opposite sides of the middle portion of the active region are exposed. An ILD is formed over the active region, wherein the ILD overlaps the end portions. The dummy gate is removed to form a recess in the ILD. A second well doping is performed through the recess, wherein the middle portion of the active region is doped during the second well doping. A gate dielectric and a gate electrode are formed in the recess to form the transistor, wherein the middle portion forms a channel region of the transistor.

In accordance with yet other embodiments, a method includes performing a first well implantation on a first and a second semiconductor strip simultaneously, wherein the first and the second semiconductor strips are between isolation regions. The isolation regions are recessed, wherein top portions of the first and the second semiconductor strips form a first and a second semiconductor fin, respectively. A first and a second dummy gate are formed to cover a first middle portion and a second middle portion of the first and the second semiconductor fins, respectively. An ILD is formed to overlap end portions of the first and the second semiconductor fins. The first and the second dummy gates are removed to form a first recess and a second recess, respectively, in the ILD. A mask is formed to cover the second middle portion of the second semiconductor fin, wherein the first middle portion of the first semiconductor fin is under an opening in the mask. A second well implantation is performed on the first middle portion, wherein impurities of a same conductivity type are introduced by the first well doping and the second well doping. After the second well implantation, the mask is removed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
performing a first well doping on a first active region and a second active region simultaneously;
forming a first dummy gate covering a first middle portion of the first active region;
forming a second dummy gate covering a second middle portion of the second active region;
removing the first and the second dummy gates;
after the step of removing the first and the second dummy gates, masking the second middle portion of the second active region with a mask;
performing a second well doping on the first middle portion when the mask is on the second middle portion, wherein end portions of the first active region on opposite sides of the first middle portion are masked during the second well doping;
after the second well doping, forming a first gate dielectric and a first gate electrode on the first middle portion to form a first transistor; and
forming a second gate dielectric and a second gate electrode on the second middle portion to form a second transistor.

2. The method of claim 1, wherein each of the first active region and the second active region is between isolation regions, and wherein the method further comprises:
recessing the isolation regions, wherein top portions of the first active region and the second active region over top surfaces of remaining portions of the isolation regions form semiconductor fins, and wherein the first and the second dummy gates are formed on sidewalls and top surfaces of the semiconductor fins, respectively.

3. The method of claim 2 further comprising, after the semiconductor fins are formed, performing an implantation to form anti-punch-through regions in the first and the second active regions.

4. The method of claim 1 further comprising forming a Static Random Access Memory (SRAM) cell, wherein the first transistor is comprised in the SRAM cell.

5. The method of claim 1, wherein in the first well doping and the second well doping, impurities with a same conductivity type are introduced.

6. The method of claim 1, wherein during the step of performing the second well doping, an entirety of the second active region is masked from receiving the second well doping.

7. The method of claim 1, wherein the second well doping is performed by implanting through a dummy gate dielectric, and wherein the dummy gate dielectric is disposed over the first middle portion of the first active region.

8. A method of forming a transistor in a Static Random Access Memory (SRAM) cell, the method comprising:
performing a first well doping on an active region;
after the first well doping, forming a dummy gate covering a middle portion of the active region, wherein end portions of the active region on opposite sides of the middle portion of the active region are exposed;
forming an Inter-Layer Dielectric (ILD) over the active region, wherein the ILD overlaps the end portions;
removing the dummy gate to form a recess in the ILD;
performing a second well doping through the recess, wherein the middle portion of the active region is doped during the second well doping; and
forming a gate dielectric and a gate electrode in the recess to form the transistor, wherein the middle portion forms a channel region of the transistor.

9. The method of claim 8, wherein the transistor is a Fin Field-Effect Transistor (FinFET), and wherein the active region comprises a semiconductor fin.

10. The method of claim 9 further comprising recessing isolation regions on opposite sides of the semiconductor fin.

11. The method of claim 10 further comprising, after the step of recessing the isolation regions, forming anti-punch-through regions in a semiconductor region underlying the semiconductor fin, wherein in the step of forming the antipunch-through regions and the first well doping, impurities of a same conductivity type are implanted.

12. The method of claim 8, wherein in the first well doping and the second well doping, impurities of a same conductivity type are implanted.

13. The method of claim 8, wherein the second well doping has a dosage between about $3E12/cm^2$ and about $3E14/cm^2$.

14. The method of claim 8, wherein during a period starting from the first well doping is performed and ending at a time after source and drain contact plugs of the transistor is formed, no pocket region is formed for the transistor.

15. A method comprising:
   performing a first well implantation on a first and a second semiconductor strip simultaneously, wherein the first and the second semiconductor strips are between isolation regions;
   recessing the isolation regions, wherein top portions of the first and the second semiconductor strips form a first and a second semiconductor fin, respectively;
   forming a first and a second dummy gate covering a first middle portion and a second middle portion of the first and the second semiconductor fins, respectively;
   forming an Inter-Layer Dielectric (ILD), wherein the ILD overlaps end portions of the first and the second semiconductor fins;
   removing the first and the second dummy gates to form a first recess and a second recess, respectively, in the ILD;
   forming a mask, wherein the mask covers the second middle portion of the second semiconductor fin, and wherein the first middle portion of the first semiconductor fin under an opening in the mask;
   performing a second well implantation on the first middle portion, wherein impurities of a same conductivity type are introduced by the first well doping and the second well doping; and
   after the second well implantation, removing the mask.

16. The method of claim 15 further comprising, after the mask is removed:
   forming a first gate dielectric and a first gate electrode on the first middle portion and in the first recess to form a first FinFET; and
   forming a second gate dielectric and a second gate electrode on the second middle portion and in the second recess to form a second FinFET.

17. The method of claim 15 further comprising forming a Static Random Access Memory (SRAM) cell, wherein the first semiconductor fin is a part of a transistor in the SRAM cell.

18. The method of claim 15 further comprising:
   forming a dummy gate dielectric over the first middle portion, wherein the second well implantation is performed through the dummy gate dielectric, and wherein the method comprises, after the second well implantation, removing the dummy gate dielectric.

19. The method of claim 15, wherein the first well implantation has a dosage between about $1E12/cm^2$ and about $5E14/cm^2$, and wherein the second well implantation has a dosage between about $3E12/cm^2$ and about $3E14/cm^2$.

20. The method of claim 15 further comprising, after the step of recessing the isolation regions, performing an anti-punch-through implantation to form anti-punch-through regions underlying the first and the second semiconductor fins.

* * * * *